United States Patent [19]

Nogami

[11] Patent Number: 5,175,604
[45] Date of Patent: Dec. 29, 1992

[54] FIELD-EFFECT TRANSISTOR DEVICE

[75] Inventor: Kazutaka Nogami, Yokohama, Japan

[73] Assignee: Kabushiki Kaisha Toshiba, Kawasaki, Japan

[21] Appl. No.: 681,665

[22] Filed: Apr. 8, 1991

Related U.S. Application Data

[63] Continuation of Ser. No. 929,359, Nov. 12, 1986, abandoned.

[30] Foreign Application Priority Data

Nov. 15, 1986 [JP] Japan .................. 62-256084

[51] Int. Cl.$^5$ .......................................... H01L 27/02
[52] U.S. Cl. ................................ 257/369; 307/303.2; 330/264; 257/919; 365/205
[58] Field of Search ................ 357/41, 45, 23.4, 42, 357/23.1, 46, 68, 71; 307/303.2, 304; 330/264, 277

[56] References Cited

U.S. PATENT DOCUMENTS

| | | | |
|---|---|---|---|
| 3,477,031 | 11/1969 | Nagata | 357/41 |
| 4,125,878 | 11/1978 | Watanabe | 357/41 |
| 4,280,855 | 7/1981 | Bertin et al. | 357/23 |
| 4,356,504 | 10/1982 | Tozun | 357/42 |
| 4,412,237 | 10/1983 | Matsumura et al. | 357/45 |
| 4,412,240 | 10/1983 | Kikuchi et al. | 357/45 |
| 4,602,270 | 7/1986 | Finegold et al. | 357/46 |
| 4,651,190 | 3/1987 | Suzuki et al. | 357/45 |
| 4,682,200 | 7/1987 | Uchida et al. | 357/41 |
| 4,748,487 | 5/1988 | Uchida | 357/43 |
| 4,780,753 | 10/1988 | Ohkura et al. | 357/45 |
| 4,780,846 | 10/1988 | Tanabe et al. | 357/45 |
| 4,783,692 | 11/1988 | Uratani et al. | 357/45 |
| 4,862,241 | 8/1989 | Ashida et al. | 357/45 |

FOREIGN PATENT DOCUMENTS

| | | | |
|---|---|---|---|
| 0056433 | 7/1982 | European Pat. Off. | |
| 1906324 | 9/1969 | Fed. Rep. of Germany | 357/41 |
| 2313196 | 10/1973 | Fed. Rep. of Germany | 357/41 |
| 2358725 | 2/1978 | France | |
| 56-015079 | 2/1981 | Japan | 357/41 |
| 59-27101 | 7/1984 | Japan | |
| 60-130855 | 7/1985 | Japan | 357/41 |
| 1421924 | 1/1976 | United Kingdom | 357/45 |

OTHER PUBLICATIONS

Ogua et al., "Design . . . Transistor", IEEE Electron Devices, vol. ED-27, No. 8, pp. 1359-1367 Aug. 1980.
Oowaki et al., "Analysis of LDD Transistor Asymmeetry Susceptibility in VLSI Circuits," IEEE IEDM Digest of Technical Papers, pp. 492-495, 1985.
Japanese Patent Disclosure (Kokai) No. 60-163456, K. Arimoto et al.
Ogura et al., "Design and Characteristics of the Lightly Doped Drain-Source (LDD) Insulated Gate Field-Effect Transistor," IEEE Electron Devices, vol. ED-27, No. 8, pp. 1359-1367, Aug. 1980.

Primary Examiner—Andrew J. James
Assistant Examiner—Courtney A. Bowers
Attorney, Agent, or Firm—Finnegan, Henderson, Farabow, Garrett and Dunner

[57] ABSTRACT

A field-effect transistor device comprising a p-type silicon substrate, a pair of n-channel MOS transistors, and a wiring means connecting the MOS transistors. The first MOS transistor has a gate electrode provided above the substrate and extending in one direction, and two regions formed in the substrate, located on two opposing sides of the gate electrode, and serving as a source and a drain. The second MIS transistor has a gate electrode provided above the substrate and extending in said one direction, and two regions formed in the substrate, located on two opposing sides of this gate electrode, and serving as a source and a drain. The wiring means includes bit lines BL and $\overline{BL}$ which permit the source-drain paths of the first and second MIS transistors to be oriented in the same direction.

6 Claims, 5 Drawing Sheets

F I G. 5
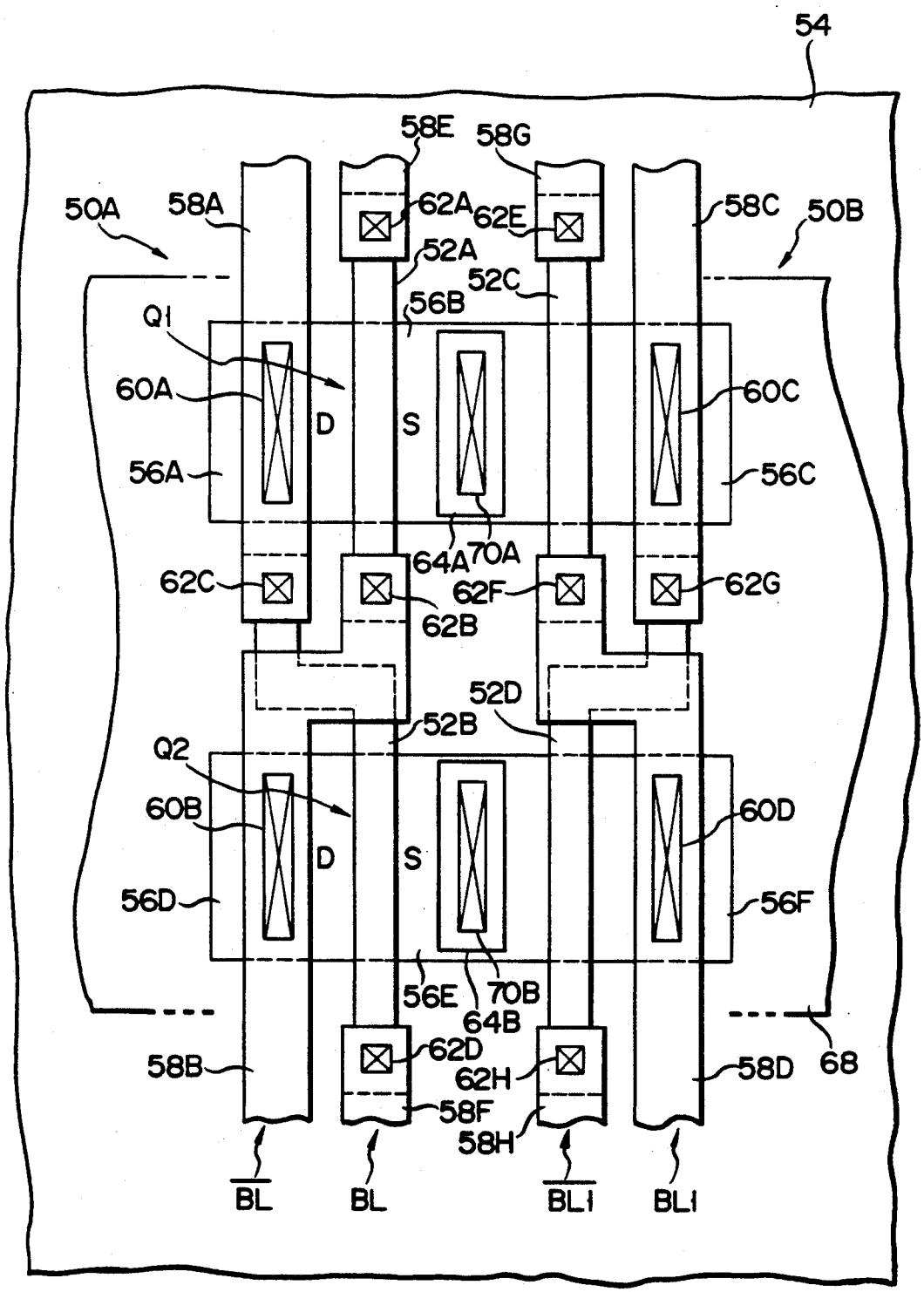

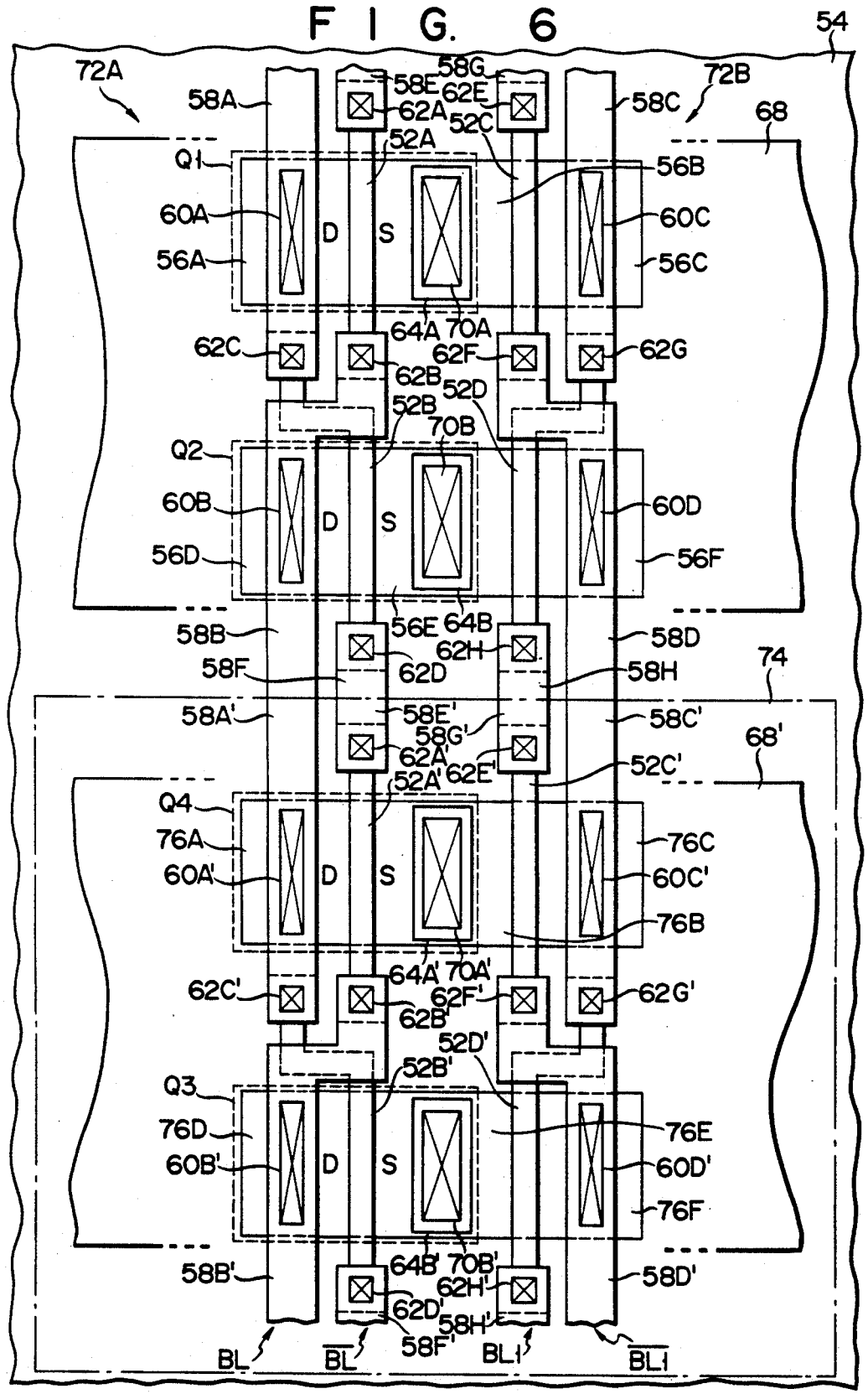

F I G. 7A
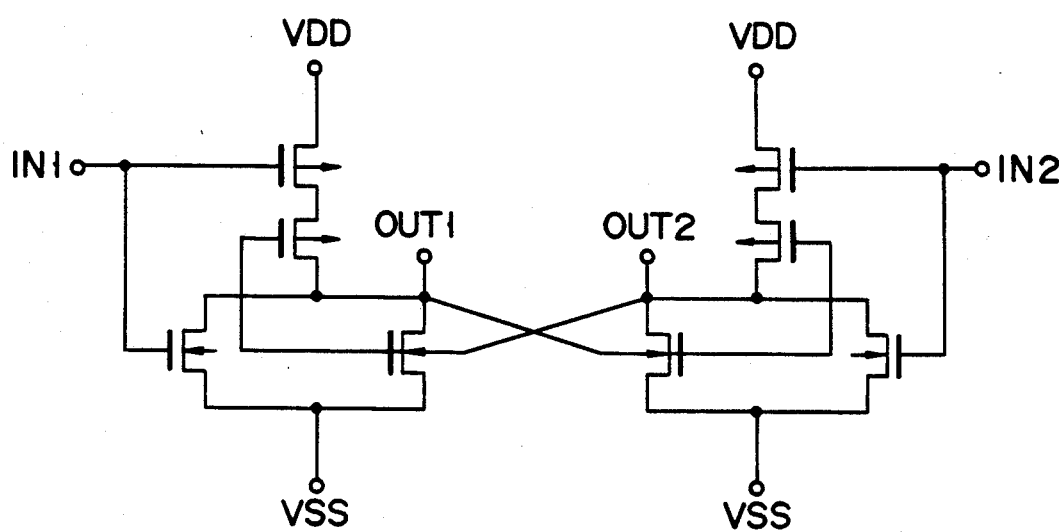
F I G. 7B
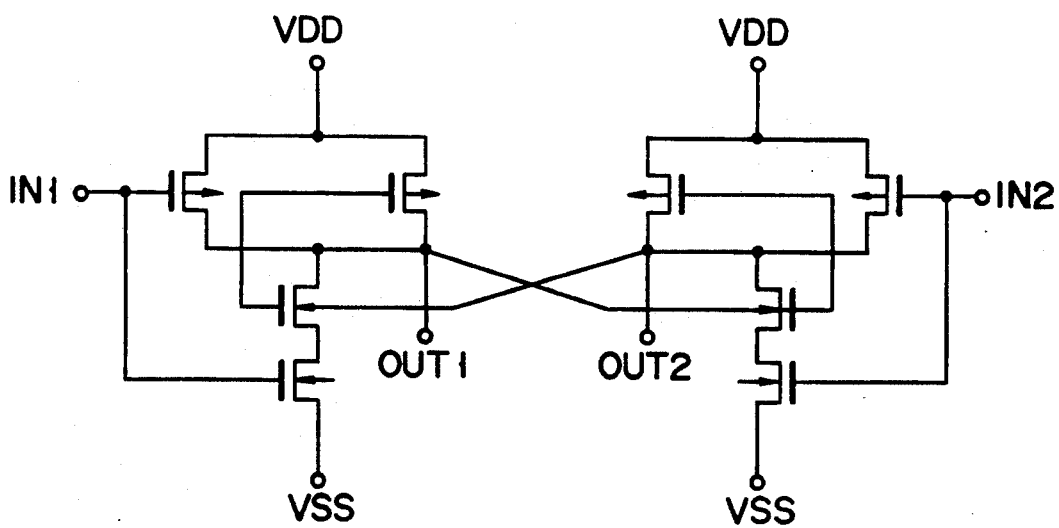

FIELD-EFFECT TRANSISTOR DEVICE

This application is a continuation of application Ser. No. 06/929,359 filed Nov. 12, 1986, now abandoned.

BACKGROUND OF THE INVENTION

The present invention relates to a field-effect transistor device, and more particularly to a field-effect transistor device having a plurality of MIS transistors forming a sense amplifier.

Most memory devices of a large capacity have a latch-type sense amplifier. FIG. 1 shows a latch-type sense amplifier having N-channel MOS transistors Q1 and Q2. Bit lines BL and $\overline{BL}$ are set at the same potential before data is transferred through them. Their potential varies when the data is transferred through them. Enable signal SAE is at the $V_{DD}$ level, e.g., 5 V. It falls to the $V_{SS}$ level, e.g., 0 V, in order to sense a potential difference corresponding to the data supplied to bit lines BL and $\overline{BL}$. When signal SAE falls to the $V_{SS}$ level, MOS transistors Q1 and Q2 are activated thereby amplifying the potential difference to a predetermined level. More specifically, the sense amplifier sets one of the bit lines BL and $\overline{BL}$ at the $V_{DD}$ level, and sets the other bit line at the $V_{SS}$ level.

FIG. 2 is a plan view of the sense amplifier shown in FIG. 1, which is formed on a semiconductor memory chip. Wiring layers 10A and 10B are, for example, formed of aluminum, electrically insulated from semiconductor substrate 12, and extend in the same direction. Gate electrode 14A of MOS transistor Q2 and gate electrode 14B of MOS transistor Q1 are also insulated from substrate 12, and extend in the same direction as wiring layers 10A and 10B. Gate electrodes 14A and 14B are made, for example, of polycrystalline silicon. Both end portions of gate electrode 14A are overlapped by wiring layers 10A. Similarly, both end portions of gate electrode 14B are overlapped by wiring layers 10B. Aluminum wiring layers 10A are connected to the ends of gate electrode 14A by means of contact holes 16A, thereby forming bit line BL. Aluminum wiring layers 10B are coupled to the ends of gate electrode 14B by means of contact holes 16B, thereby forming bit line $\overline{BL}$.

Drain region 18A and source region 18B of MOS transistor Q1 are formed within substrate 12, on the left and right sides of gate electrode 14B, respectively. Source region 20A and drain region 20B of MOS transistor Q2 are formed within substrate 12, on the left and right sides of gate electrode 14A, respectively. One of wiring layers 10A is connected to drain region 18A by means of contact hole 22A, and one of wiring layers 10B is connected to drain region 20B by means of contact hole 22B. Conductor layers 24A and 24B are formed in contact with source regions 18B and 20A. A wiring layer 26 is connected to conductor layer 24A by means of contact hole 28A and to conductor layer 24B by means of contact hole 28B. Wiring layers 10A, 10B and 26 and gate electrodes 14A and 14B are electrically insulated from one another by insulation layers (not shown).

Source region 18B and 20A and drain regions 18A and 20B have been simultaneously formed and self-aligned by ion-implantation of impurities, using gate electrodes 14A and 14B as masks. Ion implantation of this type is usually performed, as is illustrated in FIG. 3, in order to suppress the channeling effect. More specifically, the impurity ions are implanted into substrate 10 in the direction inclined to the surface of substrate 10 at a predetermined angle. Gate electrode 30 traps the impurity ions moving toward portion 31 of substrate 10. As a result, the implanted impurity ions are distributed in the substrate 10 asymmetrically with respect to the gate electrode 30.

As shown in FIG. 2, drain and source regions 18A and 18B of transistor Q1 are located on the right and left sides of gate electrode 14B, respectively, and, in contrast, drain and source regions 20B and 20A of transistor Q2 are positioned on the left and right sides of gate electrode 14A, respectively. Hence, transistors Q1 and Q2 inevitably have different characteristics. This difference is prominent, particularly when transistors Q1 and Q2 have a lightly-doped drain structure. For example, the driving ability (or, drain current) of transistor Q1 differs from that of transistor Q2 by about 30% at most.

Due to this great difference in driving ability, the sensitivity of the sense amplifier falls below the design value. If the sense amplifier is to function as desired, a greater potential difference must be provided between bit lines BL and $\overline{BL}$. Also due to the difference in driving ability, the time required for providing a sufficient potential difference between bit lines BL and $\overline{BL}$ can become longer than the maximum tolerance value. This time depends on the sensed difference in potential, i.e., the data being transferred through bit lines BL and $\overline{BL}$. It also depends on whether lines BL and $\overline{BL}$ are set at the $V_{DD}$ level and the $V_{SS}$ level, or vice versa. If this sense amplifier, which operates slowly, is used in a dynamic RAM whose memory cells must be refreshed frequently, it will cause the RAM to mulfunction.

FIG. 4 shows a sense amplifier of CMOS structure generally used. The MOS transistors forming this CMOS sense amplifier (or a MOS type flip-flop) usually have different driving abilities due to the ion implantation. Hence, the operation of the CMOS sense amplifier cannot always meet the design specifications.

SUMMARY OF THE INVENTION

It is an object of the present invention to provide a field-effect transistor device comprising field-effect transistors which have the same characteristics as the design specifications.

According to the present invention, there is provided a field-effect transistor device comprising a semiconductor substrate; a plurality of field-effect transistors, each having a gate electrode formed over the semiconductor substrate and source and drain regions self-aligned in the semiconductor substrate on two opposing sides of the gate electrode, respectively, the source-to-drain paths of the field-effect transistors being oriented in the same direction; and wiring means for connecting the plurality of the field-effect transistors.

The field-effect transistors forming the field-effect transistor device can have the same characteristics for the following reasons. In the case where impurity ions are implanted into the semiconductor substrate in a direction inclined to the surface of the substrate at a predetermined angle, the distribution of the impurity ions in the source and drain regions of either field-effect transistor are asymmetrical with respect to the gate electrode. However, the field-effect transistors can have source regions with the same distribution of impurity ions and drain regions with the same distribution of impurity ions, since the source-to-drain paths of the field-effect transistors are oriented in the same direction.

Furthermore, when the impurity concentration is low in that portion of drain region of each field-effect transistor which is close to the gate electrode, the field-effect transistor device can have a higher driving ability than the case where the source-to-drain paths of the field-effect transistors are oriented in the opposite directions.

BRIEF DESCRIPTION OF THE DRAWINGS

FIG. 5 is a plan view of a sense amplifier unit according to a first embodiment of this invention;

FIG. 6 is a plan view of a CMOS sense amplifier unit according to a second embodiment of this invention; and FIGS. 7A and 7B are circuit diagrams of two CMOS flip-flops to which the present invention is applied.

DETAILED DESCRIPTION OF THE PREFERRED EMBODIMENTS

Figure 1:
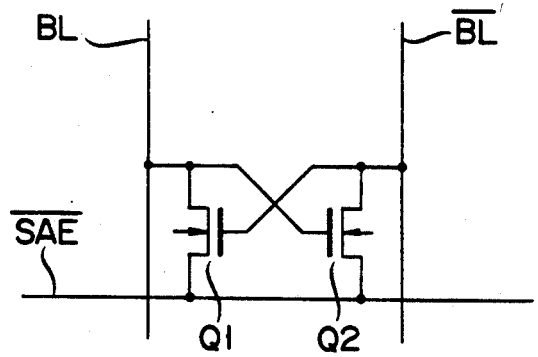
FIG. 1 is a circuit diagram of a conventional latch-type sense amplifier incorporated in a semiconductor memory.
Figure 2:
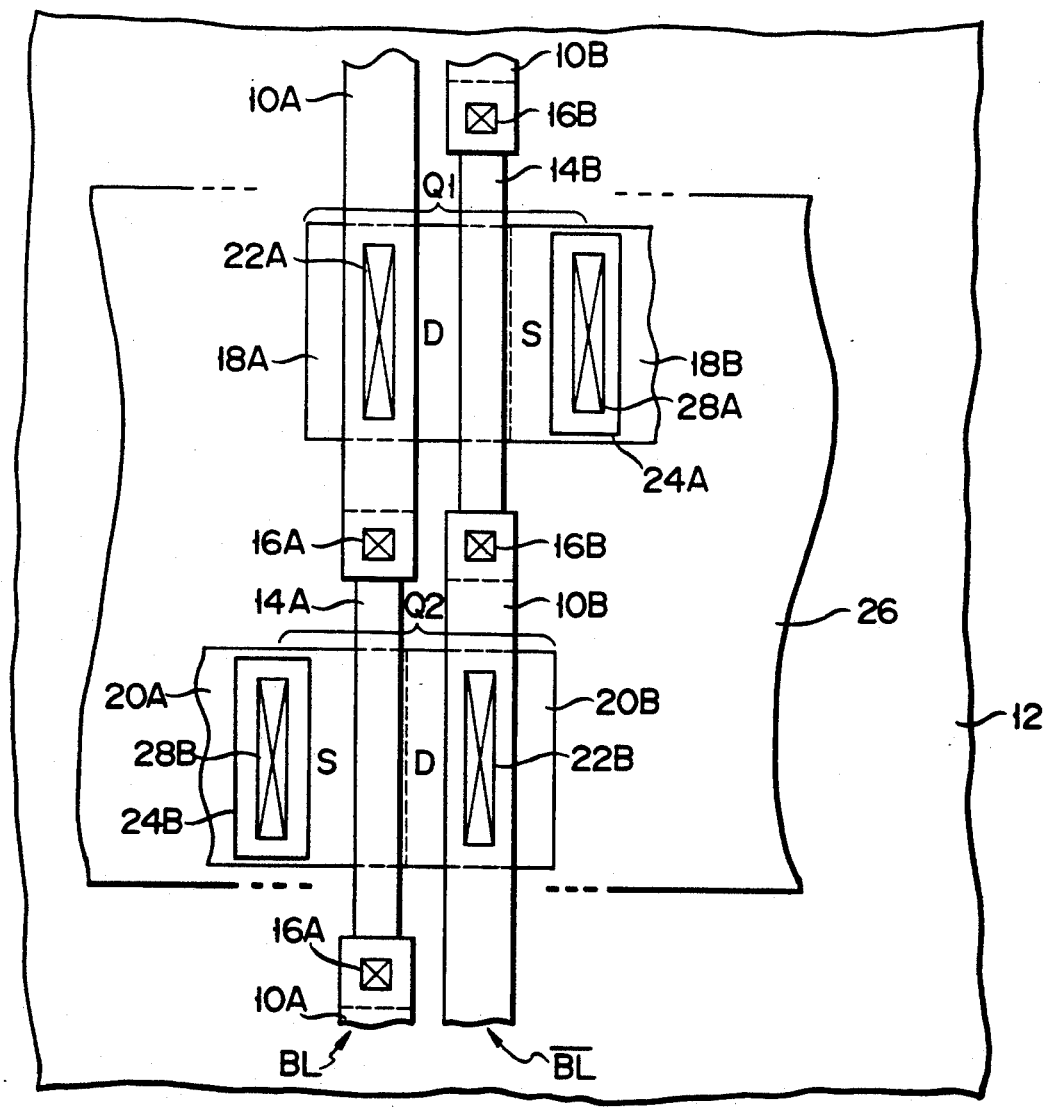
FIG. 2 is a plan view of the sense amplifier shown in FIG. 1.
Figure 3:
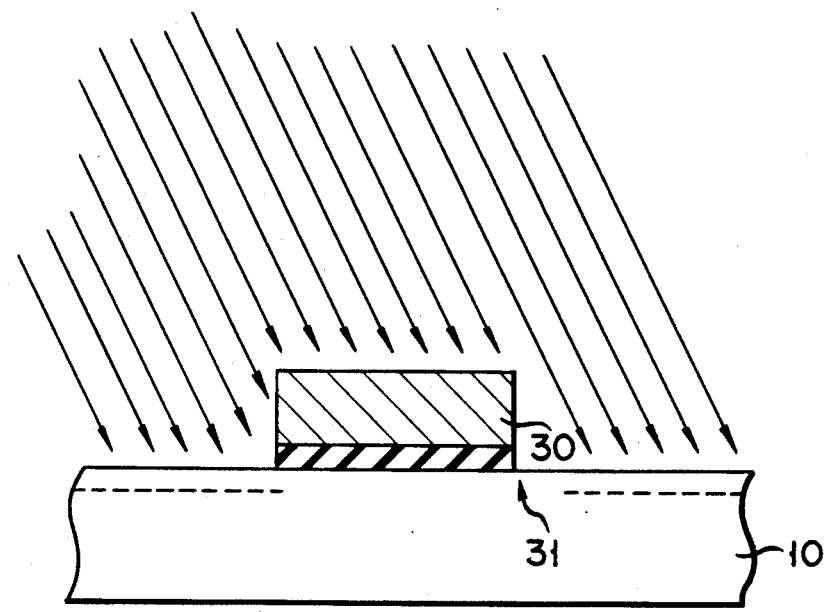
FIG. 3 is a cross-sectional view of the sense amplifier circuit, illustrating how impurity ions are implanted during the manufacture of the circuit.

A first embodiment of the invention, i.e., a latch-type sense amplifier unit, will be described with reference to FIG. 5 which is a plan view. The sense amplifier unit is combined with memory cells (not shown) to form a semiconductor memory such as a dynamic RAM. This sense amplifier unit comprises two sense amplifiers 50A and 50B which each are equivalent to the circuit of the sense amplifier illustrated in FIG. 1.

Sense amplifier 50A has conductor layers 52A and 52B provided on an insulation layer (not shown) formed on p-type silicon substrate 54. Conductor layers 52A and 52B each serve as a gate electrode and a conductor. Similarly, sense amplifier 50B has conductor layers 52C and 52D provided on the insulation layer. Conductor layers 52C and 52D each serve as a gate electrode and a conductor. Conductor layers 52A to 52D are formed, for instance, of polycrystalline silicon. As shown in FIG. 5, those portions (or electrode portions) of layers 52A to 52D which function as gate electrodes extend in the same direction.

Sense amplifiers 50A and 50B also have n-type regions 56A to 56F. Regions 56A to 56F have been formed in self alignment in substrate 54 by implanting impurity ions into substrate 54, using the electrode portion of conductor layers 52A to 52D as masks.

As is shown in FIG. 5, conductor layers 58A to 58H are provided above semiconductor regions 56A to 56F and substrate 54, and are electrically insulated therefrom. Layers 58A, 58C, 58E, 58F, 58G, and 58H extend in parallel to the electrode portions of conductor layers 52A to 52D. Layers 58B and 58D extend parallel to conductor layers 52A to 52D except in the space between regions 56A to 56C and regions 56D to 56F. Layers 58A, 58B, 58C and 58D are connected to regions 56A, 56C, 56D and 56F, by means of contact holes 60A, 60B, 60C and 60D. Conductor layer 52A is connected at one end to conductor layer 58E by means of contact hole 62A, and at the other end to conductor layer 58B by means of contact hole 62B. Conductor layer 52B is coupled at one end to conductor layer 58A by means of contact hole 62C, and at the other end to conductor layer 58F by means of contact hole 62D. Conductor layer 52C is coupled at one end to conductor layer 58G by means of contact hole 62E, and at the other end to conductor layer 58D by means of contact hole 62F. Conductor layer 52D is coupled at one end to conductor layer 58C by means of contact hole 62G, and at the other end to conductor layer 58H by means of contact hole 62H. Electrode layer 64A and 64B are formed in contact with regions 56B and 56E, respectively. Conductor layer 68 is formed above substrate 54, regions 56A to 56F, conductor layers 52A to 52D and conductor layers 58A to 58H, and are electrically insulated therefrom. Layer 68 extends at right angles to the electrode portions of conductor layers 52A to 52D. Conductor layer 68 is made, for example, of aluminum and is connected to electrode layers 64A and 64B by means of contact holes 70A and 70B.

In sense amplifier 50A, conductor layer 52A and regions 56A and 56B form n-channel MOS transistor Q1, and conductor layer 52B and regions 56D and 56E form n-channel MOS transistor Q2. Conductor layers 58A, 52B and 58F form bit line BL. Conductor layers 58E, 52A and 58B form bit line $\overline{BL}$. Enable signal SAE is supplied to conductor layer 68.

Bit lines BL and $\overline{BL}$ intersect with each other in the space between MOS transistors Q1 and Q2. They extend parallel in other locations. Hence, regions 56A and 56B function as the drain and source of MOS transistor Q1, and regions 56D and 56E function as the drain and source of MOS transistor Q2. Therefore, in substrate 54, the source-to-drain path of MOS transistor Q1 is oriented in the same direction as the source-to-drain path of MOS transistor Q2.

With the latch-type sense amplifier unit shown in FIG. 5, the ion implantation for forming regions 56A to 56F can be performed under the same conditions on both MOS transistors Q1 and Q2. Both MOS transistors can, therefore, have the identical driving ability, and such problems that would result from a difference in the driving ability can be avoided.

Figure 4:
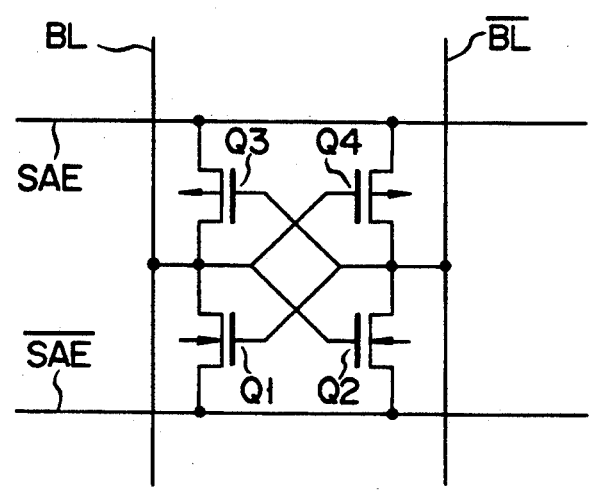
FIG. 4 is a circuit diagram of a conventional sense amplifier of CMOS structure.

FIG. 6 is a partially sectional, plan view of a CMOS sense amplifier unit according to a second embodiment of the present invention. This embodiment has two CMOS sense amplifiers 72A and 72B which each are equivalent to the circuit of the CMOS sense amplifier shown in FIG. 4. In FIG. 6, the same numerals are used to designate the same elements as used in the unit of FIG. 5, and primed numerals denote the elements not provided in the unit of FIG. 5.

As shown in FIG. 6, the CMOS sense amplifier comprises n-type well 74 formed in substrate 54, and p-type regions 76A to 76F formed in n-type well 74. Regions 76A to 76F are formed and self-aligned by implanting impurity ions into well 74, using those portions of conductor layers 56A' to 52D' which function as gate electrodes. Enable signal $\overline{SAE}$, which is an inverse to enable signal SAE, is supplied to conductor layer 68'.

In sense amplifier 72A, conductor layer 52A' and regions 76A and 76B form p-channel MOS transistor Q4, and conductor layer 52B' and regions 76D and 76E form p-channel MOS transistor Q3. Conductor layers 58A, 52B, 58F, 58E', 52A' and 58B' form bit line BL. Conductor layers 58E, 52A, 58B, 58A', 52B' and 58F' form bit line $\overline{BL}$.

In the second embodiment, bit lines BL and $\overline{\text{BL}}$ intersect with each other in the space between n-channel MOS transistors Q1 and Q2, and also in the space between p-channel MOS transistors Q3 and Q4. They extend in parallel in other locations. Hence, regions 56A and 56B function as the drain and source of MOS transistor Q1, regions 56D and 56E function as the drain and source of MOS transistor Q2, regions 76D and 76E function as the drain and source of MOS transistor Q3, and region 76A and 76B function as the drain and source of MOS transistor Q4. Therefore, in substrate 54, the source-to-drain paths of all MOS transistors Q1 to Q4 are oriented in the same direction. Therefore, the second embodiment can accomplish the same advantages as the first embodiment.

In the sense amplifier unit of FIG. 5, those portions of bit lines BL and $\overline{\text{BL}}$ which are made of polycrystalline silicon have different lengths. Bit lines BL and $\overline{\text{BL}}$ therefore have different capacitances. On the other hand, in the embodiment of FIG. 6, those portions of bit lines BL and $\overline{\text{BL}}$ which are made of polycrystalline silicon have the same length, and bit lines BL and $\overline{\text{BL}}$ have the same capacitance. Hence, the CMOS sense amplifier unit of FIG. 6 is free from a decrease in sensitivity.

The present invention is not limited to the above embodiments. It can be applied to CMOS flip-flops of the types illustrated in FIG. 7A and 7B.

Furthermore, each gate electrode can be of the Schottky barrier type which can be formed directly on a semiconductor substrate.

What is claimed is:

1. A field-effect transistor device comprising:
   a semiconductor substrate;
   first, second, third, and fourth MOS transistors, each having a gate electrode, and being spaced from each other on the semiconductor substrate, and source and drain regions in the semiconductor substrate, respectively on opposing sides of the gate electrode, the first and second MOS transistors being of a first conductivity type, the third and fourth MOS transistors being of a second conductivity type, and the source-to-drain paths of the first to fourth MOS transistors being parallel and oriented in the same direction; and
   wiring means for connecting the first and fourth MOS transistors to form a CMOS sense amplifier;
   the wiring means including a first conductive layer in contact with the drain regions of said first and fourth MOS transistors and the gate electrodes of the second and third MOS transistors, and a second conductive layer in contact with the gate electrodes of the first and fourth MOS transistors and the drain regions of the second and third MOS transistors,
   the first and second conductive layers extending across the source-to-drain paths of the first to fourth MOS transistors and having a first overlaid portion in the space between the first and second MOS transistors and a second overlaid portion in the space between the third and fourth MOS transistors, and
   the first conductive layer being below the second conductive layer within the first overlaid portion and above the second conductive layer within the second overlaid portion.

2. A field-effect transistor device according to claim 1, wherein the wiring means further includes a third conductive layer in contact with the source regions of the first and second MOS transistors, and a fourth conductive layer in contact with the source regions of the third and fourth MOS transistors.

3. A field-effect transistor device according to claim 2, wherein the third and fourth conductive layers are substantially parallel with the source-to-drain paths of the first to fourth MOS transistors.

4. A field-effect transistor device according to claim 3, wherein the third conductive layer is above said first and second MOS transistors, and the fourth conductive layer is above the third and fourth MOS transistors.

5. A field-effect transistor device according to claim 1, wherein the first and second overlaid portions are parallel to each other.

6. A field-effect transistor device comprising:
   a semiconductor substrate;
   a first and second MIS transistors each having a gate electrode, and being spaced from each other on the semiconductor substrate, and source and drain regions aligned in the semiconductor substrate, respectively on two opposing sides of the gate electrode, the source-to-drain paths of the first and second MIS transistors being parallel and oriented in the same direction; and
   wiring means for connecting the first and second MIS transistors as a sense amplifier, the wiring means including
   a first conductive layer contacting the drain region of the first MIS transistor, extending across the source-to-drain path of the second MIS transistor, and contacting the gate electrode of the second MIS transistor, and
   a second conductive layer contacting the drain region of the second MIS transistor, extending across the source-to-drain path of the first MIS transistor, and contacting the gate electrode of the first MIS transistor, the second conductive layer having a portion in vertical alignment with a portion of the first conductive layer in a space between the first and second MIS transistors, wherein portions of the first and second conducting layers other than the portions in vertical alignment are parallel to each other.

* * * * *

UNITED STATES PATENT AND TRADEMARK OFFICE
CERTIFICATE OF CORRECTION

PATENT NO. : 5,175,604
DATED : December 29, 1992
INVENTOR(S) : Kazutaka Nogami It is certified that error appears in the above-identified patent and that said Letters Patent is hereby corrected as shown below:

Abstract, title page, line 8, change "MIS" to --MOS--.

Abstract, title page, line 14, change "MIS" to --MOS--.

Foreign Application Priority Data, Front Page, change
"Nov. 15, 1986 [JP] Japan.....62-256084" to
--Nov. 15, 1985 [JP] Japan....60-256084--.

Signed and Sealed this

Eleventh Day of January, 1994

Attest:

BRUCE LEHMAN

*Attesting Officer*    *Commissioner of Patents and Trademarks*